United States Patent [19]
Meijer

[11] Patent Number: 4,859,927
[45] Date of Patent: Aug. 22, 1989

[54] POWER SUPPLY WITH IMPROVED SWITCHING REGULATOR

[75] Inventor: Robert S. Meijer, San Diego, Calif.

[73] Assignee: Fisher Scientific Company, Pittsburgh, Pa.

[21] Appl. No.: 264,259

[22] Filed: Oct. 28, 1988

[51] Int. Cl.[4] ............................................. G05F 1/565
[52] U.S. Cl. .................................. 323/284; 323/288; 323/289; 307/270
[58] Field of Search .............. 323/282, 284, 285, 288, 323/289; 307/270, 300, 313

[56] References Cited

U.S. PATENT DOCUMENTS

| | | | |
|---|---|---|---|
| 3,751,682 | 8/1973 | Howe | 307/255 |
| 4,347,445 | 8/1982 | Baker | 307/270 |
| 4,410,809 | 10/1983 | Furuichi et al. | 307/270 |
| 4,423,341 | 12/1983 | Shelly | 307/270 |
| 4,459,539 | 7/1984 | Cordy, Jr. | 323/288 |
| 4,471,245 | 9/1984 | Janutka | 307/571 |
| 4,553,082 | 11/1985 | Nesler | 323/288 |
| 4,580,070 | 4/1986 | Westman | 307/350 |
| 4,590,395 | 5/1986 | O'Connor et al. | 307/570 |
| 4,593,213 | 6/1986 | Vesce et al. | 307/564 |
| 4,598,213 | 7/1986 | Marley et al. | 307/270 |
| 4,634,903 | 1/1987 | Montorfano | 307/270 |
| 4,644,182 | 2/1987 | Kawashima et al. | 307/246 |
| 4,736,121 | 4/1988 | Cini et al. | 307/296 R |
| 4,757,251 | 7/1988 | Fuchs | 323/284 |

*Primary Examiner*—Peter S. Wong
*Attorney, Agent, or Firm*—Nydegger & Harshman

[57] ABSTRACT

A highly efficient switching regulator for a field effect transistor employed in a regulated power supply as the switching element for an unregulated power source. The emitters of a pair of complementary control transistors are coupled to the gate of the field effect transistor, while the bases of each of the control transistors are coupled to a driver circuit. The driver circuit includes a switch operated by a control unit that senses the level of the output voltage of the regulated power supply and constant current circuit. The control transistors are connected for Class C operation, so that only one control transistor is conductive at any time. A charging capacitor charged from the unregulated voltage source is coupled to the gate of the field effect transistor when one of the control transistors is conductive, causing the field effect transmission to be conductive. The field effect transistor is turned off by the other control transistor becoming conductive thereby shorting the gate of field effect transistor to the unregulated voltage supply.

20 Claims, 1 Drawing Sheet

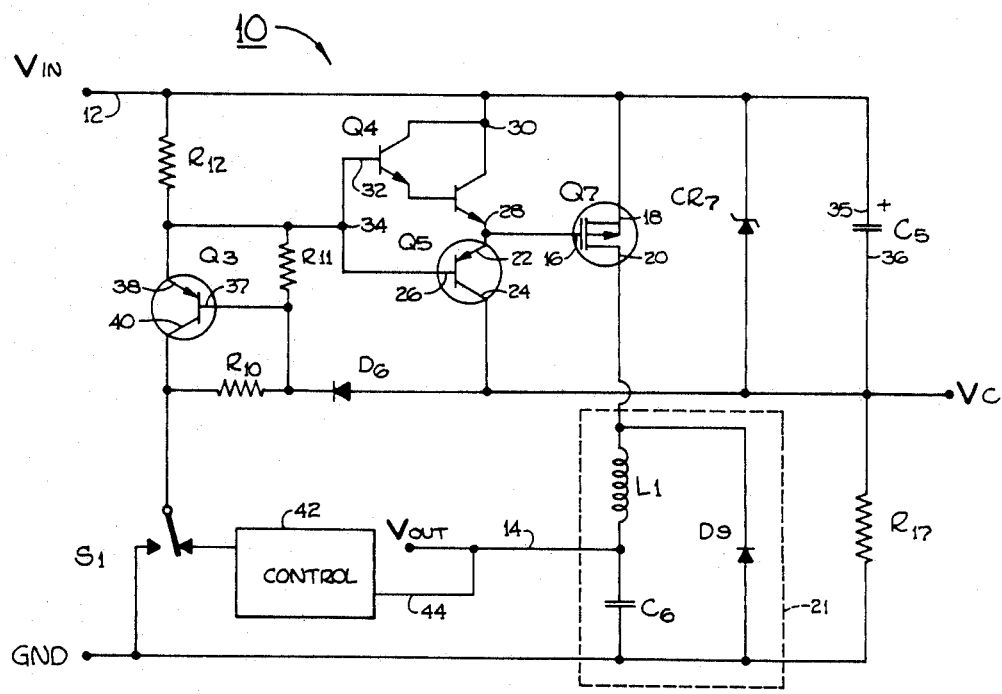

POWER SUPPLY WITH IMPROVED SWITCHING REGULATOR

BACKGROUND OF THE INVENTION

1. The Field of the Invention

The present invention relates to switched power supplies, and more particularly to high-efficiency switched power supplies that are used to achieve energy conservation and to minimize the generation of undesirable heat in associated electronic circuitry.

2. Background Art

The switching element of a switched power supply is one of the major sources of losses or inefficiency. Losses associated with the switching element are of two types. The first is associated with the switching element itself. These are primarily the result of finite switching time and non-zero conductive resistance. The second type of losses consists of those associated with driving the switching element. A common example is the power loss associated with providing the base drive to operate the switching element.

Bipolar or junction transistors are now considered disadvantageous as switching elements in this context. Such transistors consume excessive amounts of power and require that the base thereof be overdriven by excessive current. The use of a large current to drive a switching element is doubly troublesome in that the charge thereby induced to enter the base of the bipolar switching element must thereafter be drained from the base of the bipolar switching element, if that element is to be turned off. Doing so with large amounts of charge will consume time, reducing switching speed. Also, large base currents are a source of energy loss or undesirable heat generation.

Currently it is preferred as a switching element in a switched power supply to employ a power field effect transistor. Such transistors require virtually no power to remain in either the "on" or "off" state. Power field effect transistors do, however, involve significant input capacitance. This may be envisioned as a capacitance developed between the gate and the source of the field effect transistor. Typically the capacitance associated with a power field effect transistor is in the range of 1000 to 2000 pf. Before such a device can be switched on, that capacitance must be charged and before the device can be turned off, the capacitance must be discharged.

Accordingly, field effect transistors must be driven with a low impedance source if rapid switching is to be effected. Typically this is accomplished using a low value of resistor connected between the gate and emitter of the field effect transistor. This resistor serves to rapidly discharge stored gate voltage. To rapidly charge the gate junction, external current is applied to the gate resistor through a low impedance source. This rapidly charges the gate capacitance.

While the gate junction of a field effect transistor dissipates very little power, the resistor between the gate and emitter normally dissipates a relatively large amount of power. This is particularly the case where low values of resistance are used, as are necessary to achieve rapid switching. Frequently, the resistor between the gate and the emitter is connected in series with a second resistor in order to ensure that voltage applied to the gate does not exceed a predetermined maximum. This additional resistor only further serves to increase the power dissipation associated with the drive circuitry for the field effect transistor.

SUMMARY OF THE INVENTION

One object of the present invention is a highly efficient regulated power supply in which the power consumption by the switching element, as well as by the circuitry for driving that switching element, is at a minimum.

Another object of the present invention is to provide a regulated power supply as described above in which the switching element may be turned on and off rapidly.

Yet another object of the present invention is a low power switching regulator for a field effect transistor employed in a regulated power supply.

Still another object of the present invention is a method for generating a regulated voltage from a switched unregulated voltage in an energy efficient manner.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims.

To achieve the foregoing objects, and in accordance with the invention as embodied and broadly described herein, a switching regulator for a field effect transistor is provided in one embodiment of the present invention with first and second control transistors which operate the field effect transistor, a charging capacitor from which the field effect transistor is driven, and a driver means for alternatively and selectively causing one of the first and second control transistors to be conductive. The emitter of the first control transistor is coupled to the base of the field effect transistor. In this manner the field effect transistor is rendered conductive to pass current from an unregulated power source to a load when the first control transistor is conductive.

The charging capacitor is coupled to the unregulated power source so as to develop therefrom a store of charge. The charging capacitor is also connected to the collector of the first control transistor, so that the base of the field effect transistor is coupled to the charging capacitor and the store of charge thereon drives the field effect transistor when the first control transistor is conductive.

A second control transistor complementary to the first is connected therewith for Class C operation. Thus, the first and second control transistors can be conductive only in the alternative. The emitter of the second control transistor, like the emitter of the first control transistor, is coupled to the base of the field effect transistor. The collector of the second control transistor is coupled to the unregulated power supply. Thus when the second control transistor is conductive, any charge on the base of the field effect transistor is shunted away through the second control transistor, rendering the field effect transistor non-conductive.

The driver means, which is coupled to the bases of the first and second control transistors, alternately and selectively causes one of the two control transistors to be conductive. The driver means comprises a resistor connected between the unregulated power supply and the bases of the first and second control transistors; a constant current transistor having a base, an emitter, and a collector, the emitter thereof being connected to the resistor; a first constant current resistor coupled between the base of the constant current transistor and the base of the first and second control transistors; a second constant current resistor coupled between the base of the constant current transistor and the collector thereof; and a switch coupled between the emitter of the constant current transistor and ground. The switch is operated in an open collector output mode, whereby to adjust the duty cycle of the switch, and through the first and second control transistors and the field effect transistor to effect a constant voltage output.

The inventive regulator thus provides a low impedance driving circuit for a field effect transistor used in a switched power supply. Since the first and second control transistors are never on at the same time, charge from the charging capacitor is what is used to turn on the field effect transistor by charging its gate-to-emitter capacitance.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawing. Understanding that the drawing depicts only a typical embodiment of the invention and is therefore not to be considered limiting of its scope, the invention will be described with additional specificity and detail through the use of the accompanying drawing in which.

DESCRIPTION OF THE PREFERRED EMBODIMENT

Figure 1:
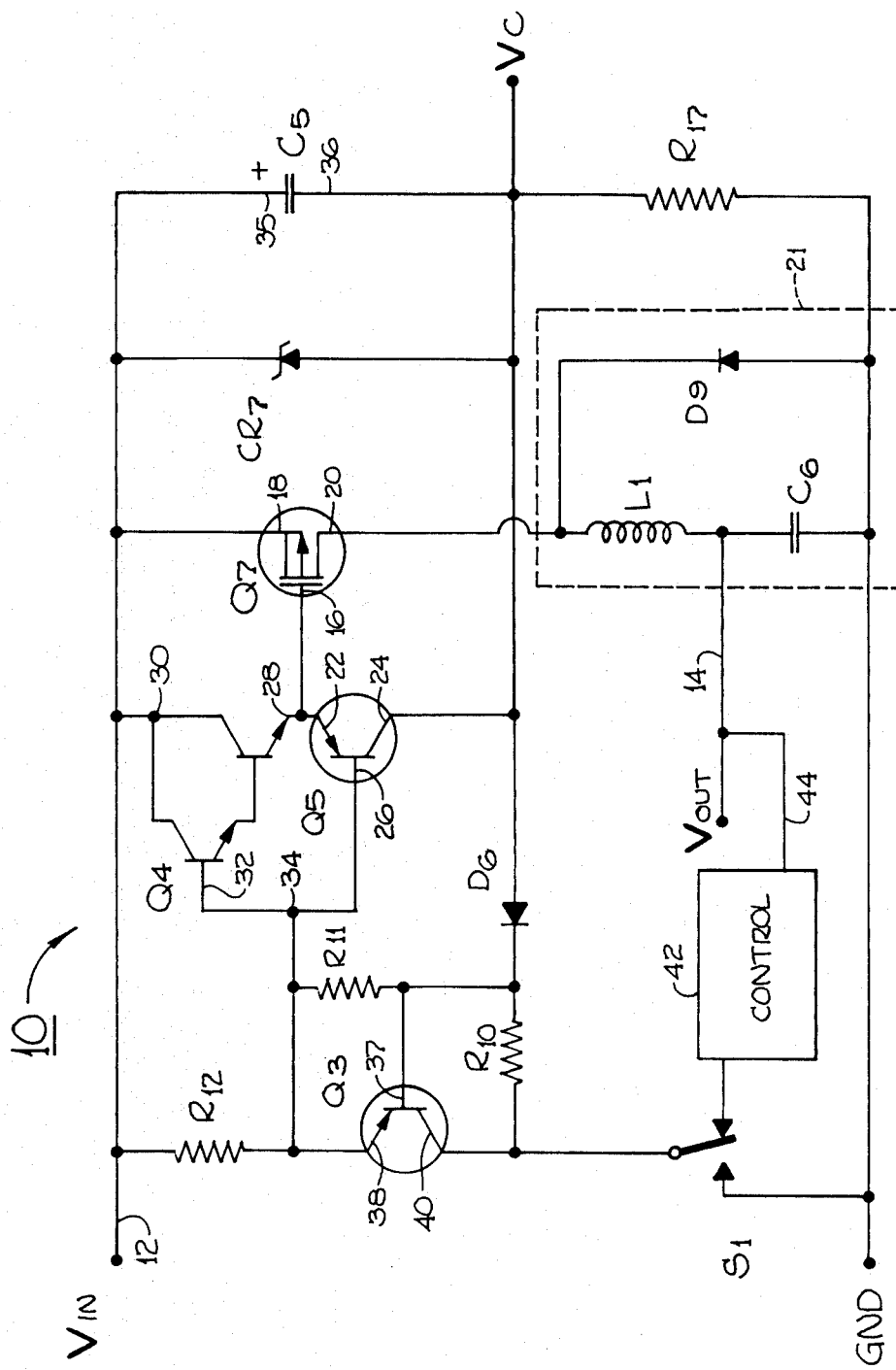
FIGURE 1 is an electrical schematic diagram of the components of one embodiment of an inventive high efficiency regulated power supply employing a field effect transistor as a switching element.

FIGURE 1 illustrates one example of a high efficiency regulated power supply 10 embodying teachings of the present invention. An unregulated power supply $V_{IN}$ is connected at input lead 12 to regulated power supply 10. The unregulated input voltage $V_{IN}$ is then modified by the action of a switching element Q7 into an output voltage $V_{OUT}$, which appears at output line 14.

Preferably switching element Q7 comprises a power field effect transistor having a gate 16, a source 18, and a drain 20. Source 18 is connected to unregulated voltage $V_{IN}$ on input line 12, while drain 20 is connected to output line 14 through a load 21 comprising an inductance $L_1$, a capacitance $C_6$, and a diode $D_9$ interconnected as shown. As the current path in switching element Q7 is connected between unregulated power source $V_{IN}$ and the load 21, current will pass from the unregulated voltage supply $V_{IN}$ to load 21 when switching element Q7 is conductive.

Switching element Q7 is a P-channel enhancement mode field effect transistor. Nevertheless, were all other transistor polarities of regulated power supply 10 to be reversed, switching element Q7 could then be an N-channel field effect transistor.

Inductance $L_1$ is conventionally associated with the drain of a power field effect transistor used as a switching element in a switched power source. The capacitor $C_6$ cooperates with inductor $L_1$ to minimize power dissipation. When switching element Q7 is on, current flows therefrom through inductor $L_1$ into capacitor $C_6$.

When switching element Q7 is turned off, however, the field developed in inductor $L_1$ attempts to collapse and the end of inductor $L_1$ at drain 20 of switching element Q7 tends to go negative. Diode $D_9$ connected in parallel to inductor $L_1$ and capacitor $C_6$ begins to conduct, and energy from the field of inductor $L_1$ serves to charge capacitor $C_6$. When switching element Q7 is again turned on, this process is repeated.

Nevertheless, rendering switching element Q7 conductive on an indiscriminate basis would defeat the purpose of regulated power supply 10, as an unregulated voltage supply $V_{IN}$ would then continually be supplied to load 21. Accordingly, switching element Q7 is only rendered conductive for short intervals, whereby adequate current passes through switching element Q7 to produce on output line 14 an average output $V_{OUT}$ voltage of a preselected and constant level. It is the function of the balance of the circuit elements shown in FIGURE 1 to rapidly turn switching element Q7 on and off so as to accomplish this objective.

Toward this end, the driving of switching element Q7 is effected by a pair of first and second control transistors Q5, Q4, respectively. Ideally, control transistors Q4, Q5 are complementary, and accordingly by way of example, second control transistor Q4 is shown in FIGURE 1 to be an NPN Darlington transistor pair, while first control transistor Q5 is shown as a PNP transistor.

First control transistor Q5 has an emitter 22, a collector 24, and a base 26. Correspondingly, second control transistor Q4 has an emitter 28, a collector 30, and a base 32. Significantly, emitter 22 of first control transistor Q5 and emitter 28 of second control transistor Q4 are both coupled to gate 16 of switching element Q7. Additionally, base 26 of first control transistor Q5 and base 32 of second control transistor Q4 are coupled together at a control node 34.

The interconnection of first and second control transistors Q5, Q4, respectively, as shown in FIGURE 1 could be considered a Class C configuration. Due to the complementary nature of first and second control transistors Q5, Q4, respectively, and their manner of interconnection, only one of first control transistor Q5 or second control transistor Q4 can be conductive at a single time. For first transistor Q5 to be rendered conductive, the voltage at base 26 thereof must be one diode drop below the emitter 22 thereof. Thus, by way of example, for first transistor Q5 to be conductive, control node 34 must be approximately 0.70 volts below the voltage on emitter 22.

Second control transistor Q4 is driven into its conductive state by an opposite polarity of voltage difference. As second control transistor Q4 is a Darlington pair, two diode drops in voltage difference must exist between the base 32 thereof and the emitter 28 thereof if second control transistor Q4 is to be conductive. Thus, by way of example, for second control transistor Q4 to become conductive, control node 34 must be approximately 1.40 volts higher than the voltage on emitter 28. While there are voltages for which neither first nor second control transistor Q5, Q4 are conductive, there is no voltage for which both are conductive.

In another aspect of the present invention, a charging capacitor $C_5$ is coupled on the positive side 35 thereof to input line 12 and to collector 30 of second control transistor Q4. The negative side 36 of charging capacitor $C_5$ is coupled to collector 24 of first control transistor Q5 and to a resistor $R_{17}$ connected to ground. Charging capacitor $C_5$ is charged from unregulated power supply $V_{IN}$. Ideally the voltage on charging capacitor $C_5$ should be in the range of approximately 5 to 7 volts. A Zener diode $CR_7$ connected in parallel to charging capacitor $C_5$ keeps the voltage developed thereon below such a predetermined threshold.

The interaction of charging capacitor $C_5$ with switching element Q7 and first and second control transistors Q5, Q4, respectively, will now be explained.

The negative side 36 of charging capacitor $C_5$ applies a charging voltage $V_c$ to collector 24 of first control transistor Q5. When first control transistor Q5 is rendered conductive by the application to control node 34 of the appropriate voltage, then the negative side of charging capacitor $C_5$ is applied through first control transistor Q5 to gate 16 of switching element Q7. Charge on charging capacitor $C_5$ then drives gate 16 of switching element Q7, which becomes conductive. This results in a rapid turn-on of switching element Q7 without significant power dissipation.

On the other hand, when the voltage at control node 34 alters, first so that first control transistor Q5 is non-conductive and then so that second control transistor Q4 becomes conductive, gate 16 of switching element Q7 is shorted through second control transistor Q4 to input line 12. This drains from switching element Q7 any charge accumulated on the gate 16 thereof, and switching element Q7 promptly turns off.

In another aspect of the present invention, a high efficiency regulated power supply, such as regulated power supply 10, is provided with a driver means coupled to base 26 of first control transistor Q5 and to base 32 of second control transistor Q4 for alternately and selectively causing one of said first and second control transistors Q5, Q4, respectively, to conduct. As shown by way of example and not limitation, a voltage generating element in the form of resistor $R_{12}$ is connected between unregulated power supply $V_{IN}$ and the bases 26, 32, respectively, of first and second control transistor Q5, Q4, respectively. It is resistor $R_{12}$ that develops the voltage to be applied to control node 34 for operating the pair of complementary control transistors Q5, Q4. Resistor $R_{12}$ should preferably be of a low value, so that when second control transistor Q4 is rendered conductive it is turned on vigorously. On the other hand, resistor $R_{12}$ should be relatively high so that when first control transistor Q5 is turned on, the current and thus the power loss through resistor $R_{12}$ is not excessive.

The driver means of the present invention also includes a constant current circuit connected in series with resistor $R_{12}$. As shown by way of example and not limitation, a constant current transistor Q3 having a base 37, an emitter 38, and and collector 40 forms the heart of the constant current circuit. Emitter 38 of constant current transistor Q3 is connected to resistor $R_{12}$, while a first constant current resistor $R_{11}$ is coupled between base 37 of constant current transistor Q3 and control node 34. A second constant current resistor $R_{10}$ is coupled between base 37 and collector 40 of constant current transistor Q3. In the absence of constant current transistor Q3, the voltage drop across resistor $R_{12}$ would be overly large, dissipating unacceptable amounts of power.

It is the aim of constant current transistor Q3 to hold the voltage at control node 34 within a predetermined small amount of the voltage on charging capacitor $C_5$. A diode $D_6$ connected between base 37 of constant current transistor Q3 and collector 24 of first control transistor Q3 clamps the base voltage of constant current transistor Q3 within one diode drop of the voltage on the negative side of charging capacitor $C_5$.

Finally, connected between collector 40 of constant current transistor Q3 and ground is a switch $S_1$. Switch $S_1$ is operated in an open collector output mode by a control unit 42 which is coupled by sense line 44 to output line 14 so as to sense the level of the output voltage $V_{OUT}$ thereon. Control unit 42 thus adjusts the duty cycle of $S_1$ in order to effect the output on output line 14 of a regulated voltage. When $S_1$ is open, no current flows through constant current transistor Q3, and switching element Q7 is non-conductive. On the other hand, with switch $S_1$ closed, current is drawn through resistor 12 and switching element Q7 is on.

The present invention efficiently switches a field effect transistor in a regulated power supply without significant loss of switching speed. The circuitry disclosed can be incorporated in any device requiring a reliable output voltage at a preselected level. Energy dissipated in the drive circuitry for the field effect transistor is minimized.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by U.S. Letters Patent is:

1. A switching regulator for a field effect transistor employed in a regulated power supply as the switching element for an unregulated power source, said switching regulator comprising:
   (a) a first control transistor having an emitter, a collector, and a base, said emitter being coupled to the gate of the field effect transistor, whereby the field effect transistor is rendered conductive to pass current from the unregulated power source to a load when said first control transistor is conductive;
   (b) a charging capacitor coupled to the unregulated power source so as to develop therefrom a store of charge, said charging capacitor being connected to said collector of said first control transistor, whereby the gate of the field effect transistor is coupled to said charging capacitor and said store of charge thereon drives the field effect transistor when said first control transistor is conductive;
   (c) a second control transistor complementary to said first control transistor and having a base, an emitter, and a collector, said first and said second control transistors being conductive in the alternative, said emitter of said second control transistor being coupled to said gate of said field effect transistor, and said collector of said second control transistor being coupled to said unregulated power supply, whereby when said second control transistor is rendered conductive, the charge on the gate of the field effect transistor is shunted therefrom through said second control transistor to said unregulated power supply rendering said field effect transistor non-conductive; and (d) driver means coupled to said base of said first control transistor and to said base of said second control transistor for alternately and selectively causing one of said first and second control transistors to conduct.

2. A switching regulator as recited in claim 1, wherein said driver means comprises:
   (a) a voltage generating element connected between the unregulated power supply and said bases of said first and said second control transistors, respectively;
   (b) a constant current circuit connected in series with said voltage generating element; and
   (c) a switch coupled between said constant current means and ground.

3. A switching regulator as recited in claim 2, wherein said voltage generating element comprises a resistor connected between the unregulated power supply and said bases of said first and second transistors.

4. A switching regulator as recited in claim 2, wherein said constant current circuit comprises:
   (a) a constant current transistor having a base, an emitter, and a collector, said emitter being connected to said voltage generating element and said collector being connected to said switch;
   (b) a first constant current resistor coupled between said base of said constant current transistor and said bases of said first and second control transistors; and
   (c) a second constant current resistor coupled between said base of said constant current transistor and said collector thereof.

5. A switching regulator as recited in claim 4, wherein said constant current circuit further comprises a diode connected between said base of said constant current transistor and said collector of said first control transistor for clamping the voltage on said base of said constant current transistor within a predetermined level of the voltage on said charging capacitor.

6. A switching regulator as recited in claim 2, wherein said switch is operated in an open collector output mode, whereby to adjust the duty cycle of said switch and through said first and second control transistors and said field effect transistor to effect a constant voltage output from said field effect transistor.

7. A switching regulator as recited in claim 1, wherein said first control transistor comprises a PNP transistor.

8. A switching regulator as recited in claim 1, wherein said second control transistor comprises a Darlington pair.

9. A switching regulator as recited in claim 1, further comprising a Zener diode connected parallel to said charging capacitor to limit the voltage thereon to a predetermined threshold.

10. A switching regulator as recited in claim 1, further comprising an inductive-capacitive circuit connected to the drain of the field effect transistor.

11. A switching regulator as recited in claim 1, further comprising a resistive element connected between said charging capacitor and ground.

12. A high efficiency regulated power supply comprising:
    (a) an unregulated power source;
    (b) a switching element, comprising a field effect transistor, said field effect transistor having a gate, a drain, and a source, said source being connected to said unregulated power source and said drain being connected to a load, whereby current passes from said unregulated voltage supply to said load when said field effect transistor is conductive;
    (c) first and second complementary control transistors, each of said control transistors having a base, an emitter, and a collector, said emitters of said first and second control transistors being coupled to said gate of said field effect transistor and said bases of said first and second control transistors being coupled together at a junction, whereby only one of said control transistors can be rendered conductive at a time;
    (d) a charging capacitor chargeable by said unregulated power supply and coupled to said collector of said first control transistor, whereby said gate of said field effect transistor becomes coupled to said charging capacitor and charge thereon is transferred as drive current to said gate of said field effect transistor rendering same conductive when said first control transistor is conductive;
    (e) a resistor connected between said unregulated power supply and said junction;
    (f) a constant current circuit connected in series with said resistor; and
    (g) a switch coupled between said constant current circuit and ground, said switch being operated in open collector output fashion, whereby to adjust the duty cycle of said switch to effect constant voltage output from said field effect transistor.

13. A high efficiency regulated power supply as recited in claim 12, wherein said constant current circuit comprises:
    (a) a constant current transistor having a base, an emitter, and a collector, said emitter being connected to said resistor and said collector being connected to said switch;
    (b) first constant current resistor coupled between said base of said constant current transistor and said bases of said first and second control transistors; and
    (c) a second constant current resistor coupled between said base of said constant current transistor and said collector thereof.

14. A high efficiency regulated power supply as recited in claim 12, further comprising a diode connected between said base of said constant current transistor and said collector of said first control transistor for clamping the voltage on said base of said constant current transistor within a predetermined level of the voltage on said charging capacitor.

15. A high efficiency regulated power supply as recited in claim 12, wherein said first control transistor comprises a PNP transistor.

16. A high efficiency regulated power supply as recited in claim 12, wherein said second control transistor comprises a Darlington pair.

17. A high efficiency regulated power supply as recited in claim 12, further comprising a Zener diode connected parallel to said charging capacitor to limit the voltage thereon to a predetermined threshold.

18. A high efficiency regulated power supply as recited in claim 12, further comprising an inductive-capacitive circuit connected to the drain of said field effect transistor.

19. A high efficiency regulated power supply as recited in claim 12, further comprising a resistive element connected between said charging capacitor and ground.

20. A method for generating a regulated voltage from a switched unregulated voltage, the method comprising the steps:
  (a) connecting the current carrying path of a field effect transistor between an unregulated voltage source and a load, said field effect transistor having a gate, a drain, and a source;
  (b) driving said field effect transistor to render same alternately conductive and non-conductive using a pair of control transistors, each of said pair of control transistors having a base, a collector, and an emitter, said emitter of each of said pair of control transistors being connected to said gate of said field effect transistor, and the base of said pair of control transistors being commonly connected, whereby only one of said pair of control transistors may be rendered conductive at a time;
  (c) charging a charging capacitor from said unregulated voltage source;
  (d) discharging said charging capacitor to said gate of said field effect transistor through the collector-emitter path of said first control transistor, thereby rendering said field effect transistor conductive;
  (e) discharging charge on said gate of said field effect transistor through said emitter-collector path of said second control transistor to render said field effect transistor non-conductive; and
  (f) alternately rendering conductive said first and said second control transistors by switching on and off current to said base of said first and second control transistors from said unregulated voltage supply according to the duty cycle required to effect constant voltage output from said field effect transistor.

* * * * *